United States Patent
Yoshii et al.

(10) Patent No.: US 7,642,022 B2
(45) Date of Patent: Jan. 5, 2010

(54) PARAMETER DETERMINATION METHOD, EXPOSURE METHOD, DEVICE FABRICATION METHOD, AND STORAGE MEDIUM

(75) Inventors: Hiroto Yoshii, Chofu (JP); Kouichirou Tsujita, Utsunomiya (JP); Koji Mikami, Nikko (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/401,343

(22) Filed: Mar. 10, 2009

(65) Prior Publication Data

US 2009/0233194 A1    Sep. 17, 2009

(30) Foreign Application Priority Data

Mar. 13, 2008    (JP) .............................. 2008-064823

(51) Int. Cl.
*G03F 9/00* (2006.01)
*G03C 5/00* (2006.01)

(52) U.S. Cl. .............................. 430/30; 716/19; 716/21

(58) Field of Classification Search .................... 430/30; 716/19, 21

See application file for complete search history.

(56) References Cited

U.S. PATENT DOCUMENTS 7,213,226 B2    5/2007 Kotani et

FOREIGN PATENT DOCUMENTS

JP    2005-062750 A    3/2005

OTHER PUBLICATIONS

Experimental Results on Optical Proximity Correction with Variable Threshold Resist Model 1997 SPIE vol. 3051 p. 458-468.
Mathematical and CAD Framework for Proximity Correction 1996 SPIE vol. 2726 p. 208-222.
Deep Ultraviolet Lithography Simulator Tuning by Resist Profile Matching 1999 SPIE vol. 3741, pp. 245-252.

*Primary Examiner*—Christopher G Young
(74) *Attorney, Agent, or Firm*—Canon U.S.A., Inc. I.P. Division

(57) ABSTRACT

The present invention provides a parameter determination method of determining an optical parameter and a process parameter by using an optical simulator which calculates a resist image to be formed on a resist applied on a substrate, based on the optical parameter of an exposure apparatus which transfers a pattern of a mask onto the substrate, and a process simulator which calculates a process image to be formed on the substrate, based on the process parameter representing information concerning the resist and information concerning a process to be performed on the resist.

7 Claims, 8 Drawing Sheets

FIG. 10

| PARAMETER NAME | UNIT | SYMBOL | PARAMETER NAME | UNIT | SYMBOL |
|---|---|---|---|---|---|
| Amplification Rate (Pre-exp.) | 1/sec | $A_{amp}$ | Maximum Develop Rate | A/sec | $R_{max}$ |
| Amplification Rate (Activation) | Kcal/mole | $E_{amp}$ | Minimum Develop Rate | A/sec | $R_{min}$ |
| Acid Loss Rate (Pre-exp.) | 1/sec | $A_\alpha$ | Developer Selectivity | – | $n$ |
| Acid Loss Rate (Activation) | Kcal/mole | $E_\alpha$ | Developer threshold PAC | – | $m_{th}$ |
| Dill's A parameter | $\mu m^{-1}$ | A | Res. Refractive Index (Real) | – | $n_{res}$ |
| Dill's B parameter | $\mu m^{-1}$ | B | Res. Refractive Index (Imag.) | – | $k_{res}$ |
| Dill's C parameter | $cm^2/mJ$ | C | ARC Refractive Index (Real) | – | $n_{are}$ |
| Relative Quencher Conc. | – | [Q] | ARC Refractive Index (Imag.) | – | $k_{are}$ |
| PEB Diffusivity (Pre-exp.) | $nm^2/sec$ | $A_{diff}$ | Relative Focus | $\mu m$ | F |
| PEB Diffusivity (Activation) | Kcal/mole | $E_{diff}$ | Amplification Reaction Order | – | O |

PARAMETER DETERMINATION METHOD, EXPOSURE METHOD, DEVICE FABRICATION METHOD, AND STORAGE MEDIUM

BACKGROUND OF THE INVENTION

1. Field of the Invention

The present invention relates to a parameter determination method, exposure method, device fabrication method, and storage medium.

2. Description of the Related Art

A projection exposure apparatus is used when fabricating a semiconductor device by using the photolithography technique. This projection exposure apparatus transfers a circuit pattern formed on a mask (or reticle) onto a photosensitive agent (resist) applied on a wafer by projecting the circuit pattern by using a projection optical system. The recent projection exposure apparatus uses the resolution enhanced technique in order to achieve micropatterning of semiconductor devices (i.e., to increase the resolution).

Examples of the resolution enhanced technique are the OAI (Off Axis Illumination) technique and OPC (Optical Proximity Correction) technique. The OAI technique forms an illumination shape (effective light source shape) into an annular shape or a multipole shape (for example, a dipole shape or quadrupole shape), and obliquely illuminates a reticle with the light. The OPC technique corrects the pattern shape of a reticle by using a lithography simulator in order to reduce the deterioration of the shape accuracy of a pattern to be formed on a wafer.

The lithography simulator is roughly classified into an optical simulator and process simulator (see Japanese Patent Laid-Open No. 2005-62750, Experimental Results on Optical Proximity Correction with Variable Threshold Resist Model (1997 SPIE Vol. 3051 pp. 458-468), and Mathematical and CAD Framework for Proximity Correction (1996 SPIE Vol. 2726 pp. 208-222)).

The optical simulator calculates a light intensity distribution (optical image) to be formed on the image plane of a projecting optical system while changing optical parameters (e.g., information pertaining to the reticle pattern and exposure conditions), thereby predicting a shape (resist image) to be formed on a resist. Accordingly, the optical simulator is generally used to determine the optical parameters.

On the other hand, the process simulator calculates a step of developing a resist exposed by an optical image while changing process (non-optical) parameters (information concerning the resist and processes), thereby predicting a shape (process image) to be formed after an etching process. In the process simulator, process models corresponding to actual processes, e.g., the photochemical reaction of a resist, an acid diffusion process performed by annealing (PEB), and patterning using a developer are prepared, and various parameters of these process models are fed back from the exposure results. Therefore, the process simulator is generally used to determine the process parameters.

Unfortunately, the conventional lithography simulators cannot simultaneously determine optical parameters and process parameters for implementing desired performance. Accordingly, the optical parameters and process parameters are independently determined such that the optical simulator determines the optical parameters, and the process simulator determines the process parameters. Recently, as micropatterning of semiconductor devices advances, it is getting harder to find the optical parameters and the process parameters to achieve desired image performance, and the mutual relationship between the optical parameters and process parameters becomes close. This makes it difficult to independently determine the optical parameters and process parameters, and prolongs the parameter determination time.

SUMMARY OF THE INVENTION

The present invention provides a parameter determination method capable of determining both optical parameters and process parameters within a short time period.

According to the first aspect of the present invention, there is provided a parameter determination method of determining an optical parameter and a process parameter by using an optical simulator which calculates a resist image to be formed on a resist applied on a substrate, based on the optical parameter of an exposure apparatus which transfers a pattern of a mask onto the substrate, and a process simulator which calculates a process image to be formed on the substrate, based on the process parameter representing information concerning the resist and information concerning a process to be performed on the resist, the method comprising a first calculating step of causing the optical simulator to calculate a light intensity distribution on the resist corresponding to an image of the pattern of the mask by changing the optical parameter, and calculate the resist image from the light intensity distribution, a first evaluating step of causing the optical simulator to evaluate whether there is a resist image meeting a first evaluation criterion among the resist images by calculated with changing the optical parameter, a second calculating step of causing the process simulator to calculate the process image by using the light intensity distribution for forming the resist image evaluated to meet the first evaluation criterion in the first evaluating step, and the process parameter, a second evaluating step of causing the process simulator to evaluate whether there is a process image meeting a second evaluation criterion among the calculated process images, and a step of outputting the optical parameter and the process parameter for forming the process image evaluated to meet the second evaluation criterion, if it is evaluated in the second evaluating step that the process image meeting the second evaluation criterion exists, and changing a calculation model of the resist image and executing the first calculating step, if it is evaluated in the second evaluating step that no process image meeting the second evaluation criterion exists.

Further features of the present invention will become apparent from the following description of exemplary embodiments with reference to the attached drawings.

BRIEF DESCRIPTION OF THE DRAWINGS

FIG. 10 is a view for explaining a process model.

DESCRIPTION OF THE EMBODIMENTS

Figure 1:
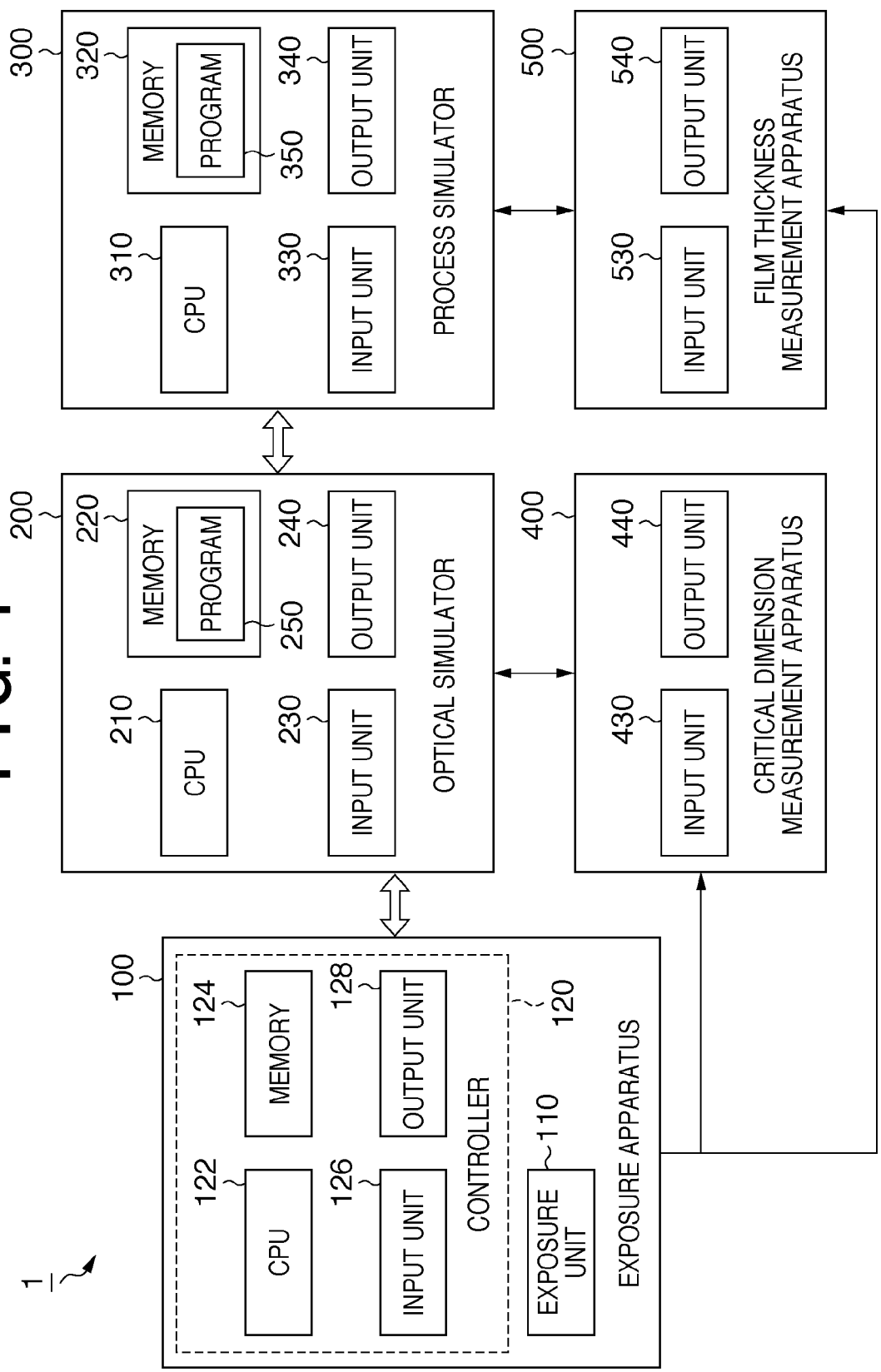
FIG. 1 is a schematic block diagram showing the configuration of an exposure system.

Preferred embodiments of the present invention will be explained below with reference to the accompanying drawings. Note that the same reference numerals denote the same parts in these drawings, and a repetitive explanation will be omitted.

FIG. 1 is a schematic block diagram showing the configuration of an exposure system 1. In this embodiment, the exposure system 1 includes an exposure apparatus 100, optical simulator 200, process simulator 300, critical dimension measurement apparatus (to be referred to as a CD measurement apparatus hereinafter) 400, and film thickness measurement apparatus 500. In the exposure system 1, the exposure apparatus 100, optical simulator 200, process simulator 300, CD measurement apparatus 400, and film thickness measurement apparatus 500 are connected across a network.

The exposure apparatus 100 includes an exposure unit 110 and controller 120.

Figure 2:
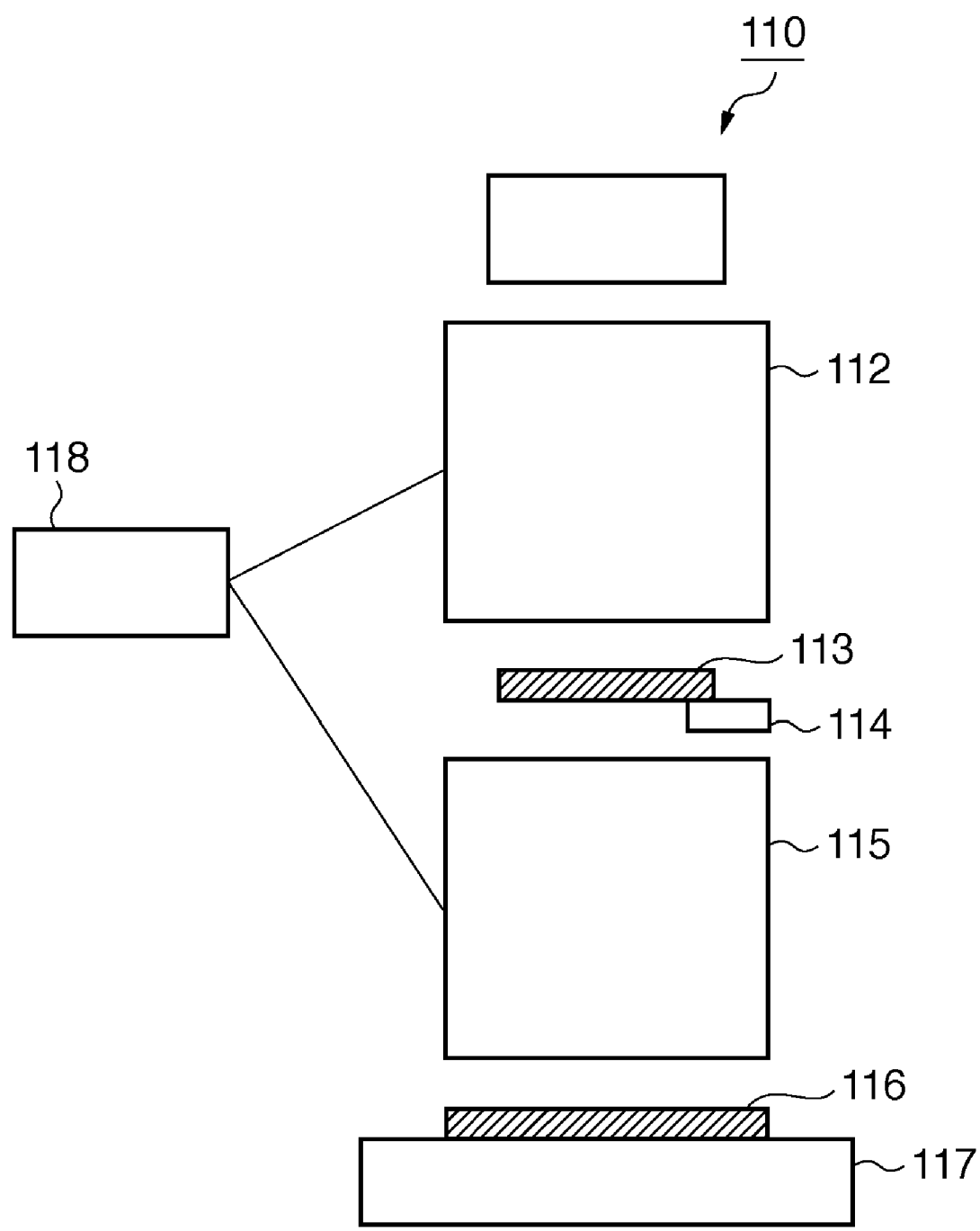
FIG. 2 is a schematic block diagram showing the arrangement of an exposure unit in an exposure apparatus of the exposure system shown in FIG. 1.

The exposure unit 110 transfers the pattern of a reticle or mask onto a substrate such as a wafer by using the step-and-scan method, the step-and-repeat method, or another exposure method. As shown in FIG. 2, the exposure unit 110 includes a light source 111, an illumination optical system 112, a reticle stage 114 for holding a reticle 113, a projection optical system 115, a wafer stage 117 for holding a wafer 116, and a measurement unit 118. FIG. 2 is a schematic block diagram showing the arrangement of the exposure unit 110.

The reticle 113 has a reticle pattern, and is positioned by the reticle stage 114. The reticle pattern is a pattern to be transferred onto the wafer 116, and includes circuit patterns of a plurality of elements forming a device such as a semiconductor device, liquid crystal display device, or thin-film magnetic head.

The wafer 116 is coated with a resist as a photosensitive agent, and positioned by the wafer stage 117. The wafer 116 is sometimes replaced with a glass plate or another substrate.

The measurement unit 118 measures an illumination shape (effective light source distribution) formed by the illuminating optical system 112, the pupil plane aberration distribution of the projecting optical system 115, and the polarized light distributions of the illumination optical system 112 and projection optical system 115.

The illumination optical system 112 illuminates the reticle 113 with the light from the light source 111. The light from the reticle 113 illuminated by the illumination optical system 112 is projected onto (the resist applied on) the wafer 116 via the projection optical system 115, thereby forming a light intensity distribution (optical image) on the wafer 116 (resist). Since the resist applied on the wafer 116 is exposed to this light intensity distribution, a latent image pattern is formed. This latent image pattern is formed into a process image (resist pattern) through processes such as processes of developing and etching the wafer 116 (resist). Normally, the light intensity distribution shape is slightly different from the process image shape formed through the processes.

In the exposure apparatus 100 shown in FIG. 1, the controller 120 includes a CPU 122, memory 124, input unit 126, and output unit 128, and controls the whole (operation) of the exposure apparatus 100. The exposure conditions (exposure recipe) for exposing the wafer 116 are input via the input unit 126, stored in the memory 124, and set in the exposure apparatus 100 by the CPU 122. The memory 124 also stores measurement results from the measurement unit 118 and the like.

The optical simulator 200 calculates a resist image to be formed on a resist applied on the wafer 116, based on optical parameters settable in the exposure apparatus 100. In this embodiment, the optical simulator 200 also has a function of determining optical parameters for achieving desired performance, and outputs the determined optical parameters to the exposure apparatus 100 so that the resist image meets an evaluation criterion.

The optical simulator 200 is implemented by installing a program 250 in a general-purpose computer. The optical simulator 200 includes, for example, a CPU 210, memory 220, input unit 230, and output unit 240. The program 250 is input via the input unit 230, and written in a predetermined form in the memory 220. Note that the memory 220 includes, for example, a DRAM and hard disk. The input unit 230 includes, for example, a keyboard, communication interface, and media reader. The output unit 240 includes, for example, a display and communication interface.

The optical simulator 200 receives the exposure conditions, the measurement results of the measurement unit 118, the information of the reticle 113, and the like from (the output unit 128) of the exposure apparatus 100 via the input unit 230. Data communication between the output unit 128 of the exposure apparatus 100 and the input unit 230 of the optical simulator 200 sometimes undergoes processing such as encryption.

The optical simulator 200 also receives the measurement result (i.e., the dimension of a process image on the wafer 116) from (an output unit 440 of) the CD measurement apparatus 400 (to be described later) via the input unit 230. By using the measurement result from the CD measurement apparatus 400, the optical simulator 200 generates a light intensity distribution model, which is a empirical resist model of translating optical image into resist image by using a light intensity distribution to be formed on the wafer 116.

The process simulator 300 calculates a process image to be formed by performing processes based on process parameters representing the information concerning a resist and the information concerning the processes to be performed on the resist. In this embodiment, the process simulator 300 also has a function of determining process parameters for achieving desired performance, and outputs the determined process parameters to a processing apparatus and the like.

The process simulator 300 is implemented by installing a program 350 in a general-purpose computer. The process simulator 300 includes, for example, a CPU 310, memory 320, input unit 330, and output unit 340. The program 350 is input via the input unit 330, and written in a predetermined form in the memory 320. Note that the memory 320 includes, for example, a DRAM, hard disk. The input unit 330 includes, for example, a keyboard, communication interface, and media reader. The output unit 340 includes, for example, a display and communication interface.

The process simulator 300 receives the exposure conditions, the information of the reticle 113, the measurement results of the CD measurement unit 400, and the like from the output unit 240 of the optical simulator 200 via the input unit 330. Data communication between the output unit 240 of the optical simulator 200 and the input unit 330 of the process simulator 300 sometimes undergoes processing such as encryption.

The process simulator 300 also receives the measurement result (i.e., the film thickness of a resist on the wafer 116) from (an output unit 540 of) the film thickness measurement apparatus 500 (to be described later) via the input unit 330. By using the measurement result from the film thickness measurement apparatus 500, the process simulator 300 generates a process model for calculating a process image.

The CD measurement apparatus 400 includes an input unit 430 and the output unit 440, and measures the dimension (shape) of a resist image exposed by the exposure apparatus 100 and formed on the wafer 116 through a development process, or of a process image to be formed on the wafer 116 through processes such as an etching process. The CD measurement apparatus 400 is, for example, a scanning electron microscope (SEM).

The film thickness measurement apparatus 500 includes an input unit 530 and the output unit 540, and measures the film thickness of a resist exposed by the exposure apparatus 100 and remaining on the wafer 116 through the processes such as the development process and etching process.

In the exposure system 1 of this embodiment, a resist image or process image is predicted while changing optical parameters settable in the exposure apparatus 100, and optical parameters for forming a process image having a predetermined shape are determined and set in the exposure apparatus 100. Similarly, in the exposure system 1 of this embodiment, a resist image or process image is predicted while changing process parameters, and process parameters for forming a process image having a predetermined shape are determined and set in the processing apparatus.

For example, the optical simulator 200 determines optical parameters for forming a process image having a predetermined shape by taking account of changes in process parameters, and provides the determined optical parameters to the controller 120 of the exposure apparatus 100. The controller 120 sets the optical parameters provided by the optical simulator 200 in the exposure apparatus 100, and operates the exposure apparatus 100.

Figure 3:
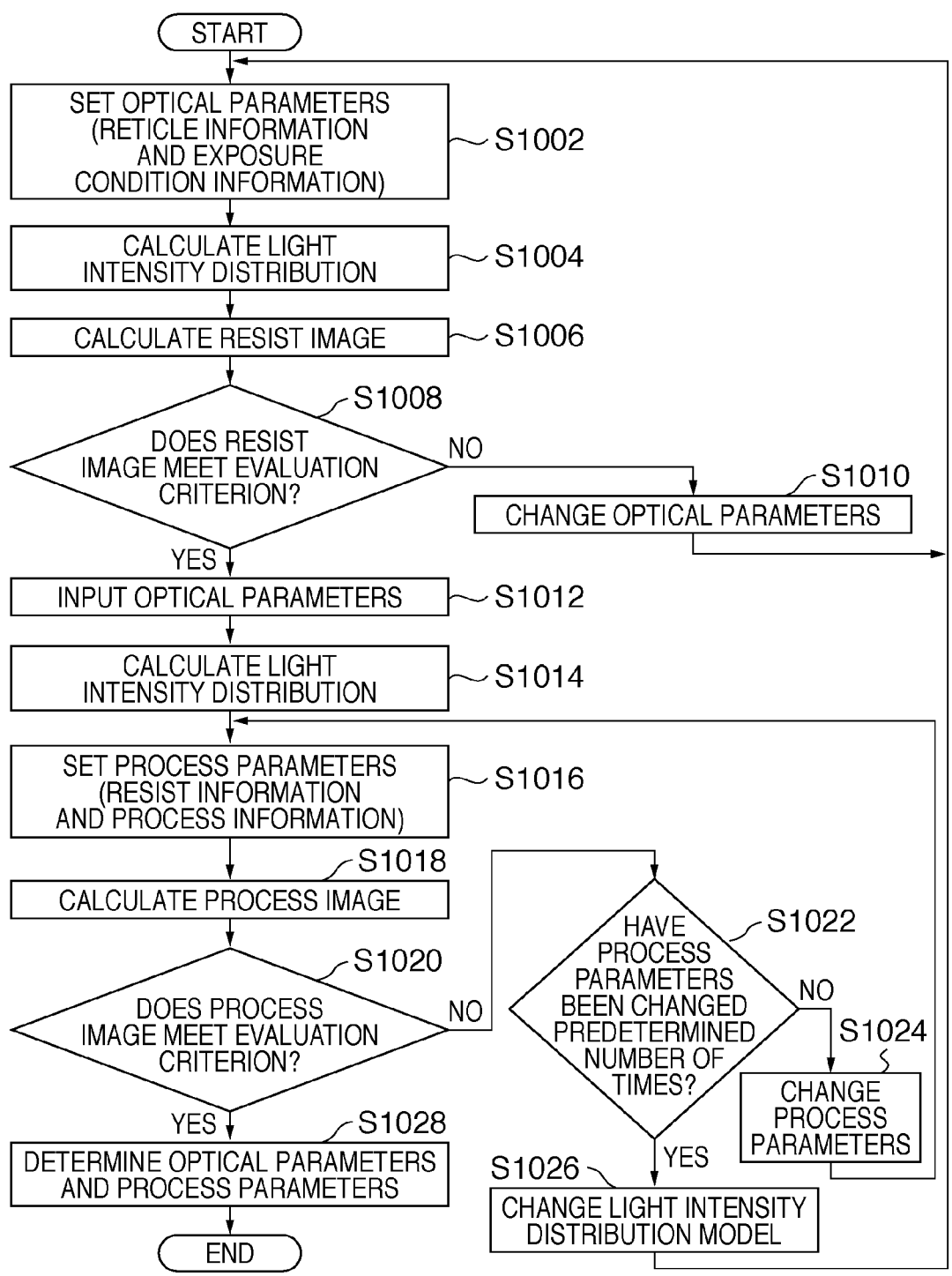
FIG. 3 is a flowchart for explaining a parameter determination method in the exposure system shown in FIG. 1.

A method (parameter determination method) of determining optical parameters and process parameters in the exposure system 1 will be explained below with reference to FIG. 3. The controller 120 of the exposure apparatus 100 executes the parameter determination method by comprehensively controlling the optical simulator 200 and process simulator 300.

First, in step S1002, the controller 120 sets optical parameters including the information of the reticle 113 and the information of the exposure conditions, based on user's instructions input via the input unit 126. The information of the reticle 113 contains information such as the two-dimensional shapes, transmittances, and phases of the reticle pattern and background. The information of the exposure conditions contains any of information pertaining to the light source and exposure apparatus, e.g., the wavelength of light emitted from the light source 111, the secondary light source distribution (shape) formed by the illumination optical system 112, the polarized light distribution, the cumulative exposure amount, and the numerical aperture, wavefront aberration, pupil transmittance distribution, and polarization characteristics of the projection optical system 115. The exposure condition information may also contain information such as the immersion refractive index characteristics, the accuracy of synchronization between the reticle stage 114 and wafer stage 117, a defocusing amount, and a light intensity distribution near the focal point when the light diffracted by the reticle 113 forms an image.

Then, in step S1004, the optical simulator 200 (CPU 210) calculates a light intensity distribution to be formed on the wafer 116, based on the optical parameters input from the exposure apparatus 100 across the network. In other words, the optical simulator 200 calculates a light intensity distribution corresponding to the reticle pattern based on the optical parameters set in step S1002.

In step S1006, the optical simulator 200 (CPU 210) calculates (predicts) a resist image by applying a pregenerated light intensity distribution model to the light intensity distribution calculated in step S1004. The light intensity distribution model is a model for calculating a resist image from the light intensity distribution, and makes it possible to calculate (predict) a resist image at very high speed. For example, the light intensity distribution model converts the light intensity distribution into a resist image by a simple function such as a multinomial by using information such as the slope, maximum value, and minimum value of the light intensity distribution, and the two-dimensional distribution and threshold value of contour lines as parameters.

In step S1008, the optical simulator 200 (CPU 210) evaluates (first evaluation) whether the resist image calculated in step S1006 is a resist image meeting an evaluation criterion (first evaluation criterion). The resist image meeting the evaluation criterion includes not only a resist image having a target shape (to be formed), but also a resist image having a shape falling within an allowable range of the target shape.

If the resist image calculated in step S1006 is not the resist image meeting the evaluation criterion, the optical simulator 200 instructs the exposure apparatus 100 to change the optical parameters. In step S1010, the controller 120 changes the optical parameters. The process then returns to step S1002, the controller 120 sets the optical parameters changed in step S1010, and the optical simulator 200 (CPU 210) executes steps S1004, S1006, and S1008 by using the changed optical parameters.

On the other hand, if the resist image calculated in step S1006 is the resist image meeting the evaluation criterion, the process advances to step S1012, and the optical simulator 200 inputs the optical parameters set in step S1002 to the process simulator 300. Consequently, the optical parameters for forming the resist image meeting the evaluation criterion are input from the optical simulator 200 to the process simulator 300. In this step, as the information of the reticle 113 included in the optical parameters, the two-dimensional shapes of the reticle pattern and background may also be converted into three-dimensional structures.

As described above, the optical parameters for forming the resist image meeting the evaluation criterion can be obtained within a short time period by repetitively calculating the light intensity distribution and resist image while changing the optical parameters by using the optical simulator 200 (first prediction). Note that the resist image is calculated by using the light intensity distribution model in step S1006 of this embodiment, but the light intensity distribution calculated in step S1004 may also be used as the resist image if it is only necessary to calculate a very rough resist image.

Subsequently, in step S1014, the process simulator 300 (CPU 310) calculates a light intensity distribution to be formed on the wafer 116, based on the optical parameters input from the optical simulator 200 across the network. The optical simulator 200 and process simulator 300 generally use different optical engines in many cases. In this embodiment, therefore, the light intensity distribution is recalculated in step S1014. However, if the optical engines of the optical simulator 200 and process simulator 300 are identical, the light intensity distribution calculated in step S1004 may also be acquired from the optical simulator 200 without recalculating any light intensity distribution in step S1014.

In step S1016, the controller 120 sets process parameters including the information of a resist to be applied on the wafer 116 and the information of processes to be performed by the processing apparatus, based on user's instructions input via the input unit 126. The resist information contains information such as the absorption coefficient of light, the diffusion length of an acid, the residual film thickness-to-dose relationship, the influence of a basic contaminant, the film thickness, the presence/absence of an antireflection film, and the reflectance. The process information contains information such as the time and temperature of soft-baking performed after resist coating, the standing time after exposure, the PEB temperature, the PEB time, the developer, the developing rate, and the etching rate. Note that some of these pieces of information contain the results of measurements performed by the film thickness measurement apparatus 500.

Then, in step S1018, the process simulator 300 (CPU 310) calculates (predicts) a process image based on the light intensity distribution calculated in step S1014 and the process parameters set in step S1016. When calculating (predicting) a process image, the process simulator 300 uses a pregenerated process model. The process model represents actual processes, and is generated by superposing a plurality of models such as a resist acid diffusion model, photosensitive model, PEB model, and development model. Since the process model is thus very complicated, the process image calculation in step S1018 requires a time longer than that of the resist image calculation in step S1006.

The process simulator 300 uses the process model and hence can calculate a process image corresponding to both the optical parameters and process parameters. Also, when the influence of the physical properties of the resist applied on the wafer 116 is large (i.e., when transferring very fine patterns), the process simulator 300 can predict a process image in accordance with the physical phenomenon.

In step S1020, the process simulator 300 (CPU 310) evaluates (second evaluation) whether the process image calculated in step S1018 is a process image meeting an evaluation criterion (second evaluation criterion). The process image meeting the evaluation criterion includes not only a process image having a target shape (to be formed), but also a process image having a shape falling within an allowable range of the target shape.

If the process image calculated in step S1018 is not the process image meeting the evaluation criterion, the process advances to step S1022, and the process simulator 300 determinates whether the process parameters set in step S1016 have been changed a predetermined number of times.

If the process parameters have not been changed the predetermined number of times, the process simulator 300 instructs the exposure apparatus 100 to change the process parameters. In step S1024, the controller 120 changes the process parameters. The process then returns to step S1016, and the controller 120 sets the process parameters changed in step S1010. After that, the process simulator 300 (CPU 310) executes steps S1018 and S1020 by using the changed parameters.

If the process parameters have been changed the predetermined number of times, the process simulator 300 instructs the optical simulator 200 to change the light intensity distribution model. In step S1026, the optical simulator 200 derives a light intensity distribution model from process parameters for forming a process image closest to the process image meeting the evaluation criterion, and changes the light intensity distribution model S1026 to the calculated light intensity distribution model. Consequently, in step S1012, the optical simulator 200 inputs optical parameters different from the previous optical parameters to the process simulator 300.

On the other hand, if the process image calculated in step S1018 is the process image meeting the evaluation criterion, optical parameters and process parameters for implementing desired performance are determined in step S1028. More specifically, the optical parameters set in step S1002 and the process parameters set in step S1016 are determined as the optical parameters and process parameters for implementing desired performance.

In this embodiment as described above, the optical parameters predetermined by the optical simulator 200 are input to the process simulator 300, and a process image is calculated (predicted) while changing the process parameters (second prediction). Process parameters for forming a process image meeting an evaluation criterion are determined from the process image calculated by the process simulator 300. Accordingly, the parameter determination method of this embodiment can determine both the optical parameters and process parameters within a short time period.

The optical parameters determined by the parameter determination method of this embodiment are set in the exposure apparatus 100, and the wafer 116 coated with a resist represented by the process parameters determined by the parameter determination method of this embodiment is exposed. A process image having a predetermined shape can be formed by performing, on the exposed wafer 116, processes represented by the process parameters determined by the parameter determination method of this embodiment. Consequently, the exposure system 1 can economically provide a high-quality device (e.g., a semiconductor element, LCD element, imaging element (CCD or the like), or thin-film magnetic head) with high throughput.

Note that the memory 220 of the optical simulator 200 may also store, in the form of a database, Jones Matrix or the like representing the actual secondary light source distribution formed by the illuminating optical system 112, the polarization performance, and the wavefront aberration, pupil transmittance distribution, and polarization characteristics of the projecting optical system 115. This allows the process simulator 300 to strictly calculate a light intensity distribution and process image.

Methods of generating the light intensity distribution model to be used in the calculation of the resist image in step S1006 and the process model to be used in the calculation of the process image in step S1018 will be explained below.

Figure 4:
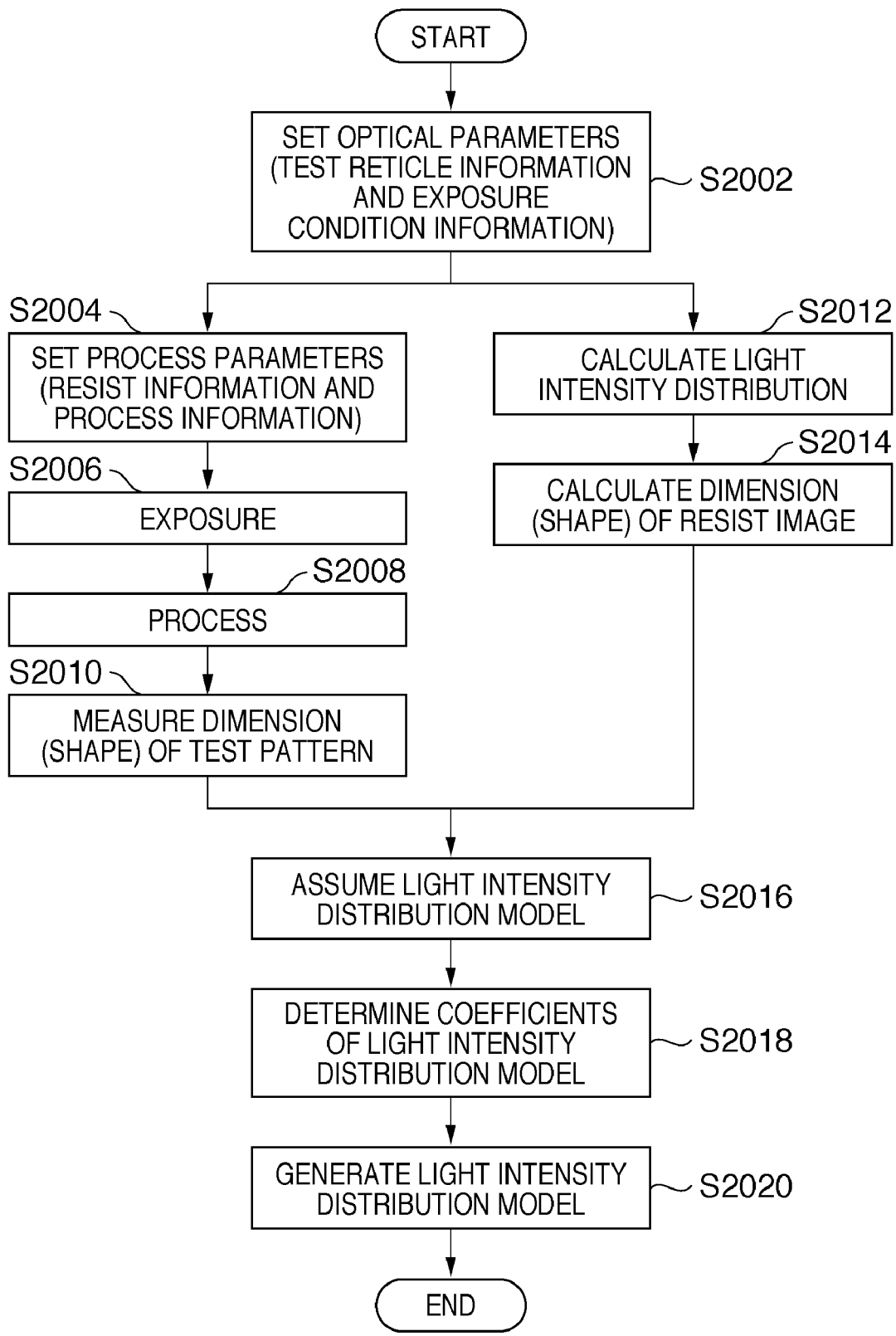
FIG. 4 is a flowchart for explaining a light intensity distribution model generation method.
Figure 7:
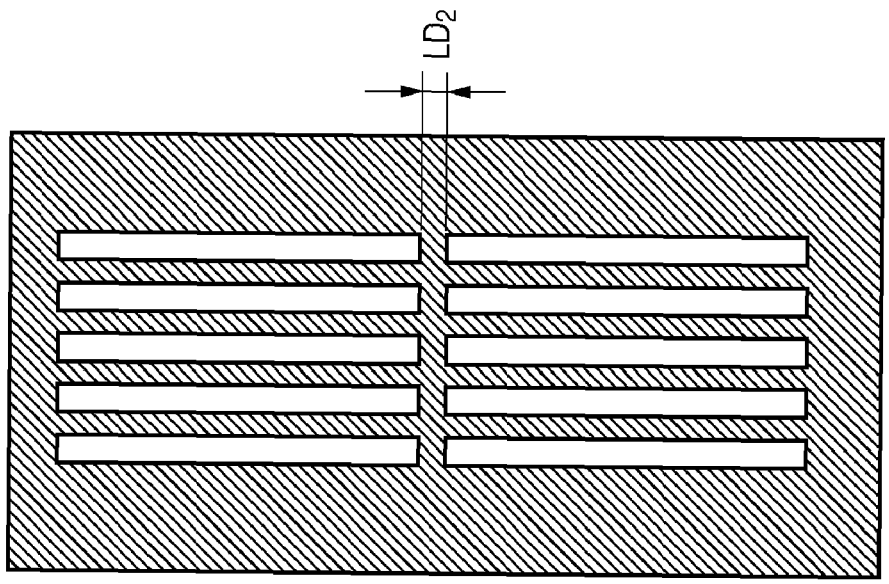
FIG. 7 is a view showing still another example of the test pattern of the test reticle.
Figure 6:
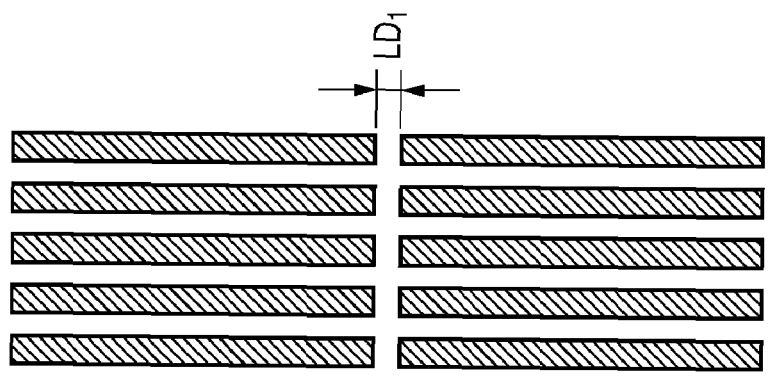
FIG. 6 is a view sowing another example of the test pattern of the test reticle.
Figure 5:
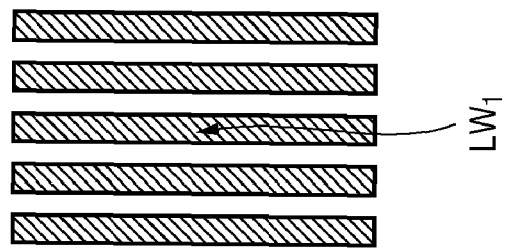
FIG. 5 is a view showing an example of the test pattern of a test reticle.

First, the light intensity distribution model generation method will be explained below with reference to FIG. 4. In step S2002, optical parameters including the information of a test reticle and the information of exposure conditions are set. Unlike the reticle 113, the test reticle has a test pattern for generating a light intensity distribution model. As shown in FIGS. 5, 6, and 7, the test pattern of the test reticle includes patterns that facilitate measurements of the line width and line end width. The exposure condition information indicates exposure conditions to be set in the exposure apparatus 100 when generating a light intensity distribution model. FIGS. 5 to 7 are views showing examples of the test pattern of the test reticle. Note that the reticle information herein mentioned may be a combination of two-dimensional figures indicating the transmittance and phase of the reticle pattern, and may also be a three-dimensional structure including the amount of digging and the like.

In step S2004, process parameters including the information of a resist to be used when generating a light intensity distribution model and the information of processes are set. The optical simulator 200 must generate another light intensity distribution model if the process parameters (the resist to be applied on the wafer 116 or the processes) are changed. In step S2004, therefore, the resist information and processes to be simulated must be set in the optical simulator 200.

In step S2006, the exposure conditions and test reticle set in step S2002 are set in the exposure apparatus 100, and the wafer 116 coated with the resist set in step S2004 is exposed.

In step S2008, the process (development) set in step S2004 is performed on the resist exposed in step S2006. In this manner, a test pattern (resist image) is formed on the resist.

In step S2010, the CD measurement apparatus 400 measures the dimension (shape) of the test pattern formed on the resist. For example, a line width $LW_1$ is measured for the test pattern shown in FIG. 5, and line intervals $LD_1$ and $LD_2$ are respectively measured for the test patterns shown in FIGS. 6 and 7. The three dimensions are measured for a plurality of test patterns having the pattern line width, line interval, and gap length as parameters.

In step S2012, the optical parameters (test reticle information and exposure condition information) set in step S2002 are input to the optical simulator 200, and a light intensity distribution is calculated.

In step S2014, a resist image is predicted by binarizing the light intensity distribution calculated in step S2012 on a predetermined slice level (threshold value), and the dimension (shape) of the resist image is calculated (extracted) in the same position as that measured in step S2010. Also, a curved shape near the measurement point, the logarithmic slope, maximum value, and minimum value of the light intensity distribution along the measurement direction are calculated (extracted).

In step S2016, the test pattern dimension measured in step S2010 is compared with the resist image dimension calculated in step S2014. Then, a light intensity distribution model (for calculating a resist image from the light intensity distribution) to be fitted on the test pattern dimension measured in step S2010 is assumed by using the various parameters of the light intensity distribution as functions. For example, the light intensity distribution model can be assumed as indicated by equations 1 and 2 below.

Light Intensity Distribution Model 1

(Resist image dimension calculated in step $S2014$)= (uniform slice dimension of light intensity distribution in step $S2012$)+$C1 \times$curvature+$C2 \times$logarithmic slope+$C3$     (1)

Light Intensity Distribution Model 2

(Slice value equivalent to resist image dimension calculated in step $S2014$)=(uniform slice value of light intensity distribution in step $S2012$)+$\Sigma\{Ck \times$curvature$^k$+$C1 \times$logarithmic slope$^l$+$Cm \times$maximum value$^m$+$Cn \times$minimum value$^n\}$     (2)

In step S2018, a difference between the test pattern dimension measured in step S2010 and the resist image dimension calculated in step S2014 is calculated, and the coefficients (for example, C1 and C2) of the light intensity distribution model are determined by the method of least squares or the like.

In step S2020, a light intensity distribution model is generated based on the light intensity distribution model assumed in step S2016 and the light intensity distribution model coefficients determined in step S2018.

Figure 8:
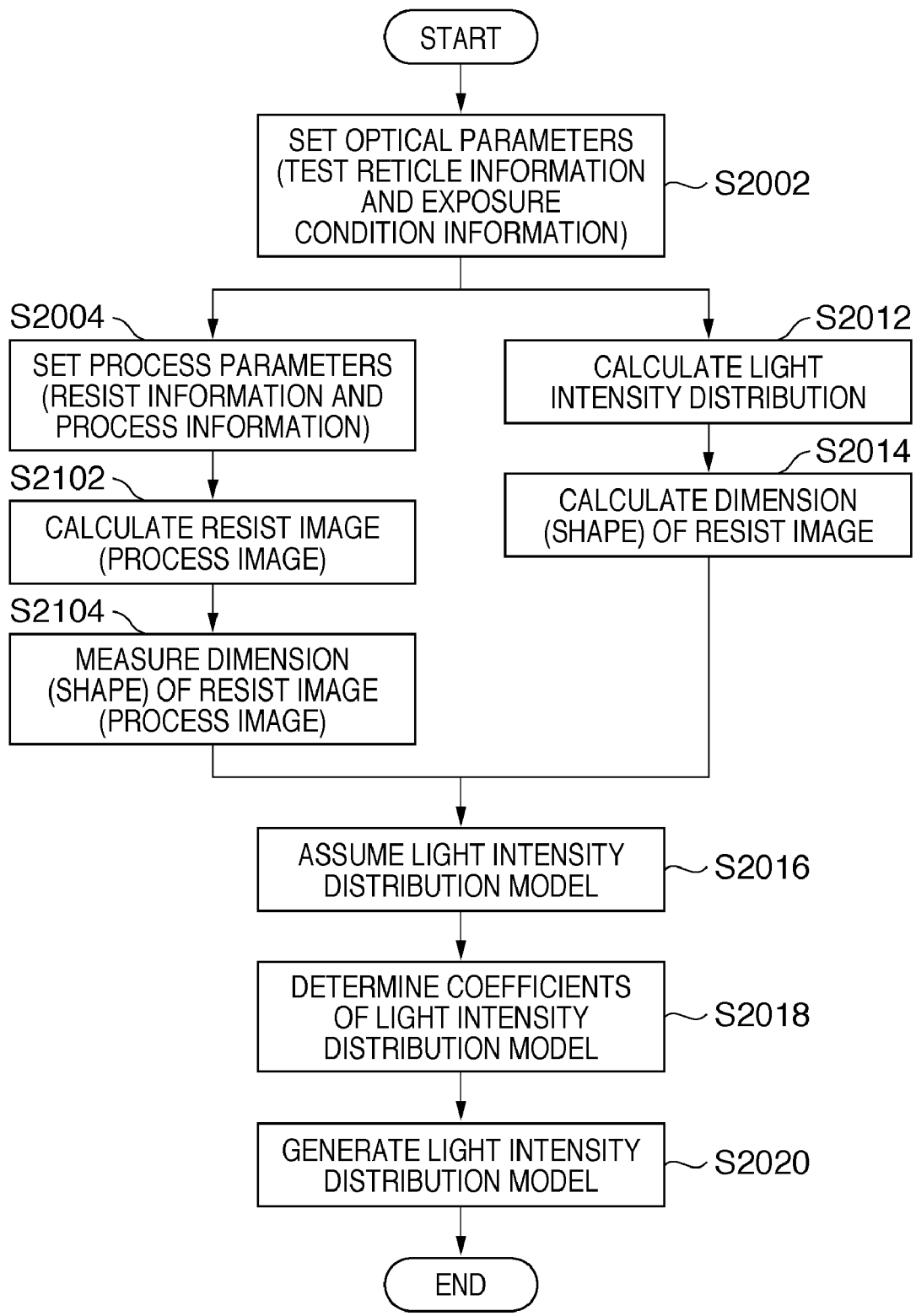
FIG. 8 is a flowchart for explaining a light intensity distribution model generation method.

Note that in the exposure system 1, the optical simulator 200 and process simulator 300 are connected across the network, so the results obtained by the process simulator 300 can be easily used when generating a light intensity distribution model. As shown in FIG. 8, therefore, a resist image (process image) calculated (predicted) by the process simulator 300 can be used instead of actually exposing the wafer (step S2006) or actually performing the processes (step S2008). More specifically, in step S2102, the optical parameters set in step S2002 and the process parameters set in step S2004 are input to the process simulator 300, thereby calculating a resist image (process image). In step S2104, the dimension (shape) of the resist image (process image) calculated in step S2102 is calculated (extracted). In the generation method shown in FIG. 8, it is unnecessary to actually expose the wafer and perform the processes. Therefore, this method can generate a light intensity distribution model faster and more easily than the generation method shown in FIG. 4. This makes the method particularly effective when changing the light intensity distribution model in step S1026 of FIG. 3. In this case, as described previously, process parameters for forming a process image closest to the process image meeting the evaluation criterion need only be set in step S2004, among the process parameters that have been changed the predetermined number of times. FIG. 8 is a flowchart for explaining the light intensity distribution model generation method.

Figure 9:
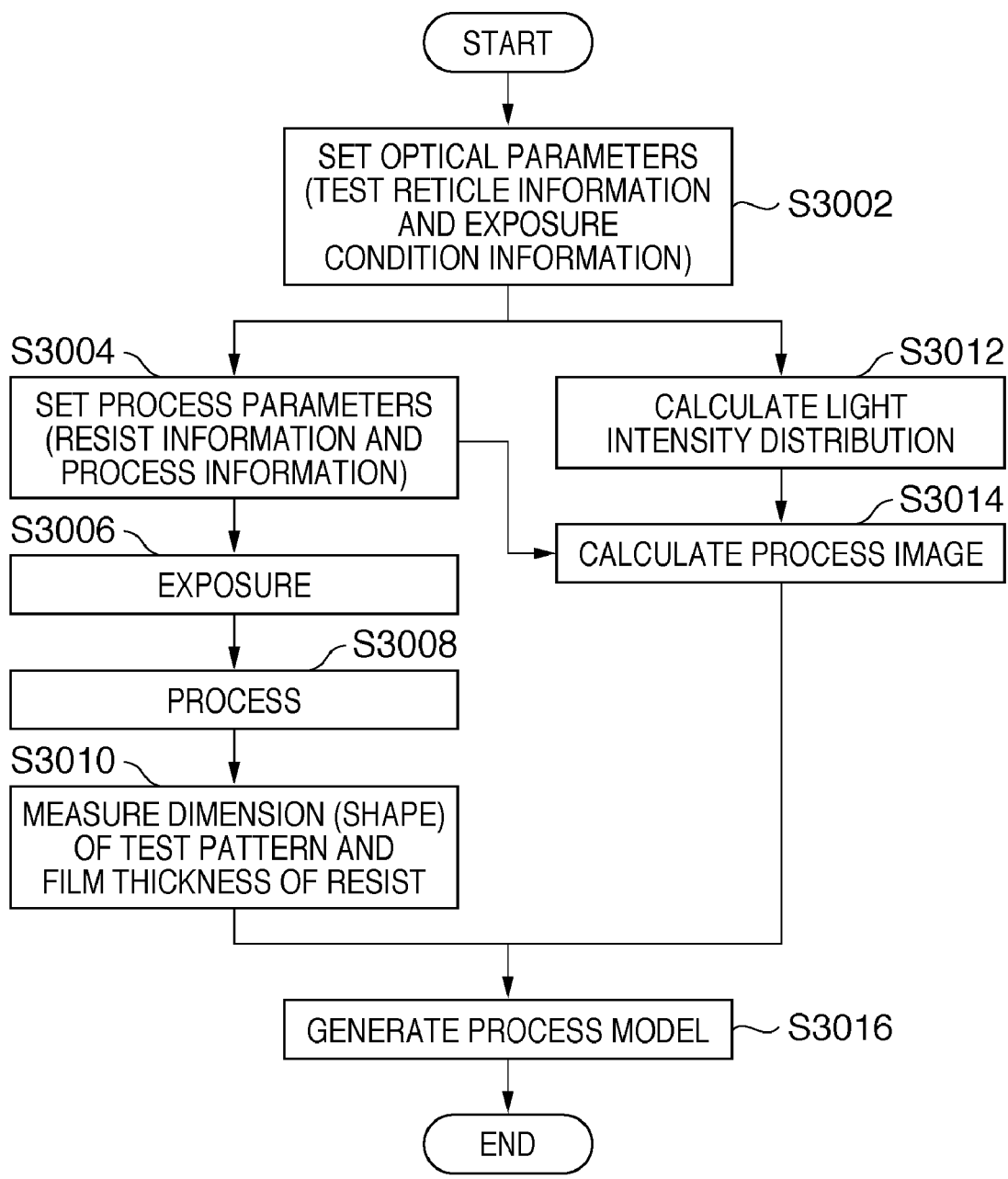
FIG. 9 is a flowchart for explaining a process model generation method.

The process model generation method will now be explained with reference to FIG. 9. The settings of the initial values of process parameters are explained in detail by well-known process simulators (e.g., Prolith of KLA-tencor, SOLID-E of Synopsys, and EM-suite of Panoramic Technology), so a detailed explanation will be omitted. The following explanation exemplifies a method of tuning (adjusting) process parameters in accordance with the exposure results, after the initial values of the process parameters are set.

In step S3002, optical parameters including the information of a test reticle and the information of exposure conditions are set. Unlike the reticle 113, the test reticle has a test pattern for generating a process model. The test pattern of the test reticle has a pattern that facilitates measurements of the line width and line end width, and a pattern having a region in which no light-shielding portion exists over a broad range within which the film thickness of a resist can be measured. The exposure condition information indicates exposure conditions to be set in the exposure apparatus 100 when generating a process model.

In step S3004, process parameters including the information of a resist to be used when generating a process model and the information of processes are set.

In step S3006, the exposure conditions and test reticle set in step S3002 are set in the exposure apparatus 100, and the wafer 116 coated with the resist set in step S3004 is exposed.

In step S3008, the processes set in step S3004 are performed on the wafer 116 exposed in step S3006. In this way, the test pattern is formed on the wafer 116. Also, a residual film of the resist is formed in the region having no light-shielding portion, while sequentially changing the exposure amount.

In step S3010, the CD measurement apparatus 400 measures the dimension (shape) of the test pattern formed on the wafer 116, and the film thickness measurement apparatus 500 measures the film thickness of the resist in the region having no light-shielding portion.

In step S3012, a light intensity distribution is calculated based on the optical parameters (test reticle information and exposure condition information) set in step S3002.

In step S3014, a process image corresponding to the light intensity distribution calculated in step S3012 is calculated, based on the process parameters set in step S3004.

In step S3016, a process model is generated from the dimension (shape) of the test pattern formed on the wafer 116 and the film thickness of the resist in the region having no light-shielding portion, both of which are measured in step S3010, and the process image calculated in step S3014. As described previously, the process model is generated by superposing models representing various physical phenomena as shown in FIG. 10. FIG. 10 is a view for explaining examples of the process parameters related to the process model. That is, FIG. 10 is a view showing, as an example, the model disclosed in the following reference.

Deep Ultraviolet Lithography Simulator Tuning by Resist Profile Matching (Proc. SPIE Vol. 3741, pp. 245-252, 1999)

Note that it is also possible to predict a process image corresponding to various optical images (i.e., various optical parameters) and simultaneously determine optical parameters and process parameters by using the process simulator alone. However, since a process model for predicting a process image is complicated, the process simulator takes a long time to predict the process image (i.e., requires a long time to calculate the process image). Accordingly, using the process simulator alone to determine optical parameters is unrealistic.

A method of fabricating a device (e.g., a semiconductor IC element or liquid crystal display element) using the above-mentioned exposure apparatus will be explained below. The device is fabricated through a step of setting the exposure conditions determined as described previously in the exposure apparatus, and exposing a substrate (e.g., a wafer or glass substrate) coated with a photosensitive agent by using the set exposure apparatus, a step of developing the substrate (photosensitive agent), and other well-known steps. This device fabrication method can fabricate devices having quality higher than that of the conventional devices. Thus, the device fabrication method using the exposure system 1 and a device as the product also constitute an aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-064823 filed on Mar. 13, 2008, which is hereby incorporated by reference herein in its entirety.

What is claimed is:

1. A parameter determination method of determining an optical parameter and a process parameter by using an optical simulator which calculates a resist image to be formed on a resist applied on a substrate, based on the optical parameter of an exposure apparatus which transfers a pattern of a mask onto the substrate, and a process simulator which calculates a process image to be formed on the substrate, based on the process parameter representing information concerning the resist and information concerning a process to be performed on the resist, the method comprising:

a first calculating step of causing the optical simulator to calculate a light intensity distribution on the resist corresponding to an image of the pattern of the mask by changing the optical parameter, and calculate the resist image from the light intensity distribution;

a first evaluating step of causing the optical simulator to evaluate whether there is a resist image meeting a first evaluation criterion among the resist images by calculated with changing the optical parameter;

a second calculating step of causing the process simulator to calculate the process image by using the light intensity distribution for forming the resist image evaluated to meet the first evaluation criterion in the first evaluating step, and the process parameter;

a second evaluating step of causing the process simulator to evaluate whether there is a process image meeting a second evaluation criterion among the calculated process images; and a step of outputting the optical parameter and the process parameter for forming the process image evaluated to meet the second evaluation criterion, if it is evaluated in the second evaluating step that the process image meeting the second evaluation criterion exists, and changing a calculation model of the resist image and executing the first calculating step, if it is evaluated in the second evaluating step that no process image meeting the second evaluation criterion exists.

2. The method according to claim 1, wherein if it is evaluated in the second evaluating step that no process image meeting the second evaluation criterion exists, the method further comprises:

a determinating step of causing the process simulator to determinate whether the process parameter has been changed a predetermined number of times; and a changing step of changing the process parameter if it is determinated in the determinating step that the process parameter has not been changed the predetermined number of times.

3. The method according to claim 2, wherein a calculation model of the resist image is changed by using a process parameter for forming a process image closest to the second evaluation criterion among the process images calculated in the second calculating step.

4. The method according to claim 1, wherein the optical parameter includes a three-dimensional structure of the mask.

5. An exposure method comprising:

a determining step of determining an optical parameter of an exposure apparatus which transfers a pattern of a mask onto a substrate, and a process parameter representing information concerning a resist and information concerning a process to be performed on the resist, by using a parameter determination method according to claim 1;

a setting step of setting the optical parameter determined in the determining step in the exposure apparatus; and a step of exposing a resist represented by the process parameter determined in the determining step, by using the exposure apparatus in which the optical parameter is set in the setting step.

6. A device fabrication method comprising steps of:

exposing a substrate using an exposure method according to claim 5; and performing a development process for the substrate exposed.

7. A storage medium storing a program which causes a computer to execute a process of calculating a resist image to be formed on a resist applied on a substrate, based on an optical parameter of an exposure apparatus which transfers a pattern of a mask onto the substrate, and calculating a process image to be formed on the substrate, based on a process parameter representing information concerning the resist and information concerning a process to be performed on the resist, thereby determining the optical parameter and the process parameter, the program causing the computer to operate as an optical simulator and a process simulator, and execute:

a first calculating step of causing the optical simulator to calculate a light intensity distribution on the resist corresponding to an image of the pattern of the mask by using the optical parameter, and calculate the resist image from the light intensity distribution;

a first evaluating step of causing the optical simulator to evaluate whether there is a resist image meeting a first evaluation criterion among the resist images by calculated with changing the optical parameter;

a second calculating step of causing the process simulator to calculate the process image by using the light intensity distribution for forming the resist image evaluated to meet the first evaluation criterion in the first evaluating step, and the process parameter;

a second evaluating step of causing the process simulator to evaluate whether there is a process image meeting a second evaluation criterion among the calculated process images; and a step of outputting the optical parameter and the process parameter for forming the process image evaluated to meet the second evaluation criterion, if it is evaluated in the second evaluating step that the process image meeting the second evaluation criterion exists, and changing a calculation model of the resist image and executing the first calculating step, if it is evaluated in the second evaluating step that no process image meeting the second evaluation criterion exists.

* * * * *